(12) United States Patent
Liu

(10) Patent No.: US 12,463,621 B2
(45) Date of Patent: Nov. 4, 2025

(54) EQUIVALENT SERIES RESISTANCE COMPENSATION CIRCUIT, CONSTANT-FREQUENCY TURN-ON CIRCUIT AND VOLTAGE CONVERSION DEVICE

(71) Applicant: NUVOTON TECHNOLOGY CORPORATION, Hsinchu (TW)

(72) Inventor: Chun Hsin Liu, Zhubei (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 68 days.

(21) Appl. No.: 18/493,399

(22) Filed: Oct. 24, 2023

(65) Prior Publication Data

US 2024/0243734 A1 Jul. 18, 2024

(30) Foreign Application Priority Data

Jan. 17, 2023 (TW) ................................ 112102074

(51) Int. Cl.
*H03K 3/02* (2006.01)
*H02M 1/00* (2006.01)
*H02M 3/158* (2006.01)
*H03K 3/0233* (2006.01)
*H03K 5/24* (2006.01)

(52) U.S. Cl.
CPC ...... *H03K 3/02335* (2013.01); *H02M 1/0025* (2021.05); *H02M 3/158* (2013.01); *H03K 5/249* (2013.01)

(58) Field of Classification Search
CPC . H03K 3/02335; H03K 5/249; H02M 1/0025; H02M 3/158
See application file for complete search history.

(56) References Cited

U.S. PATENT DOCUMENTS

2015/0268681 A1* 9/2015 Liu .................... G05F 1/575
323/280
2021/0184563 A1* 6/2021 Ruan .................. H02M 3/158

* cited by examiner

*Primary Examiner* — Daniel C Puentes
(74) *Attorney, Agent, or Firm* — MUNCY, GEISSLER, OLDS & LOWE, P.C.

(57) ABSTRACT

A ramp voltage signal generated by an equivalent series resistance compensation circuit in prior art is not linear, and average amplitude and maximum amplitude of the ramp voltage signal changes with an input voltage and a turn-on time. It results in a comparison result or compensation value generated by a comparator of the constant-frequency turn-on circuit will change accordingly and is difficult to control. Thus, it is difficult to design the stability of the system. The embodiments of the present disclosure design an equivalent series resistance compensation circuit including hardware circuits. Through functions of these hardware circuits, a ramp voltage signal of which average amplitude and a maximum amplitude are constant is generated, thereby solving problems encountered in the prior art.

14 Claims, 9 Drawing Sheets

EQUIVALENT SERIES RESISTANCE COMPENSATION CIRCUIT, CONSTANT-FREQUENCY TURN-ON CIRCUIT AND VOLTAGE CONVERSION DEVICE

CROSS-REFERENCE TO RELATED APPLICATION

This application claims the priority from the TW patent application No. 112102074, filed on Jan. 17, 2022, and all contents of such TW Patent Application are included in the present disclosure.

BACKGROUND

1. Field of the Invention

The present disclosure relates to an equivalent series resistance compensation technology for a constant-frequency turn-on circuit in a voltage conversion device, in particular to, an equivalent series resistance compensation circuit that can make the maximum amplitude and the average amplitude of the generated ramp voltage signal constant, a constant-frequency turn-on circuit using the equivalent series resistance compensation circuit, and a voltage converter using the constant-frequency turn-on circuit.

2. Description of the Related Art

A driving transistor of a direct current-to-direct current (DC-to-DC) low voltage-drop converter, such as a bulk voltage converter, is usually controlled by a constant-frequency turn-on circuit, so that the low voltage-drop converter has high light-load efficiency and fast load transient response speed. The constant-frequency turn-on circuit generates a turn-on time signal with information of the turn-on time, so that the driving circuit can control the low voltage-drop converter to be turned on or off, thereby achieving the above functions. However, the existing constant-frequency turn-on circuit needs to utilize a comparator to compare a ramp voltage signal with the average amplitude of the ramp voltage signal, and compare a feedback voltage with a reference voltage. However, the average amplitude and the maximum amplitude of the ramp voltage signal are not constant values. Moreover, the average amplitude and the maximum amplitude of the ramp voltage signal are associated with the input voltage and the turn-on time of the low voltage-drop converter. Therefore, the ramp voltage signal is not linear and magnitudes of the ramp voltage signal changes with the input voltage and the turn-on time. In this way, the compensation value generated by the comparator changes accordingly and is difficult to control. As a result, it is difficult to design the stability of the system.

Please refer to FIG. 1, FIG. 1 is a circuit diagram of a voltage converter of a prior art. The voltage conversion device 1 comprises the voltage converter 10, the driving circuit 11, the equivalent series resistance compensation circuit 12, the comparator 13 and the turn-on time signal generator 14. The driving circuit 11, the equivalent series resistance compensation circuit 12, the comparator 13 and turn-on time signal generator 14 form a constant-frequency turn-on circuit. The voltage converter 10 is electrically connected to the driving 11 and the comparator 13. The turn-on time signal generator 14 is electrically connected to the comparator 13, the equivalent series resistance compensation circuit 12 and the driving circuit 11. The comparator 13 is electrically connected the equivalent series resistance compensation circuit 12. The voltage converter 10 is a DC-to-DC low voltage-drop converter. The voltage converter 10 is composed of the driving transistor MT1, the diode D1, the inductor L1, the capacitor C4, the resistors R5 and R6. The voltage converter 10 drops the input voltage Vin and generates the output voltage Vout. Due to the existence of the inductor L1, the constant-frequency turn-on circuit is needed to control the voltage converter 10 to achieve high light-load efficiency and fast load transient response speed.

The driving circuit 11 receives the turn-on time signal Ton_sig with the information of the turn-on time Ton. Then, the driving circuit 11 generates the driving signal Drv to the driving transistor MT1 and generates the clock signal DT0 with a duty period and a period T to the equivalent series resistance compensation circuit 12 based on the turn-on time signal Ton_sig. The equivalent series resistance compensation circuit 12 generates the ramp voltage signal Vramp and the average amplitude Vramp_avg of the ramp voltage signal Vramp to the comparator 13 based on the clock signal DT0. The comparator 13 compares the ramp voltage signal Vramp and the average amplitude Vramp_avg and compares the reference voltage Vref and the feedback voltage. The feedback voltage is generated based on the resistors R5, R6 and the output voltage Vout. The turn-on time signal generator 14 receives a comparison result of the comparator 13 and the average amplitude Vramp_avg, thereby generating the turn-on time signal Ton_sig with the information of the turn-on time Ton.

Please refer to FIG. 1 and FIG. 2, FIG. 2 is a waveform diagram of a ramp voltage signal corresponding to clock signals of different duty periods of a voltage converter of a prior art. The equivalent series resistance compensation circuit 12 is usually a low-pass filter. Thus, the generated ramp voltage signal Vramp is still proportional to the input voltage Vin, and the average amplitude Vramp_avg is proportional to the input voltage Vin and the duty period. As shown in FIG. 2, when the period is T and the clock signals DT1 and DT2 with the turn-on times Ton1 and Ton2 respectively are used as the clock signal DT0 of FIG. 1, the ramp voltage signal Vramp generated by the equivalent series resistance compensation circuit 12 is respectively the ramp voltage signals Vramp1 and Vramp2. Since the turn-on times Ton1 and Ton2 are difference from each other, the maximum amplitudes of the ramp voltage signals Vramp1 and Vramp2 are different from each other, and the average amplitudes of the ramp voltage signals Vramp1 and Vramp2 are also different from each other. Therefore, the ramp voltage signal Vramp is not linear and the magnitudes of the ramp voltage signal Vramp, such as the average amplitude and the maximum amplitude of the ramp voltage signal Vramp, change with the input voltage Vin and the turn-on time Ton, so that the comparison result generated by the comparator 13, that is, the compensation value, changes accordingly and is difficult to control. As a result, it is difficult to design the stability of the system.

SUMMARY

It can be understood from the above description that the technical problems to be solved in the present disclosure are how to allow the equivalent series resistance compensation circuit to produce a ramp voltage signal that is more linear, and an average amplitude and maximum amplitude of the ramp voltage signal are constant, so that the voltage conversion device has better stability of the system.

In order to solve the above-mentioned conventional problems, an embodiment of the present disclosure provides an equivalent series resistance compensation circuit. The equivalent series resistance compensation circuit comprises a low-pass filter, a voltage divider and a compensator. The low-pass filter is configured to perform a low-pass filtering on the first clock signal with the first duty period to generate the first sensing voltage and perform the low-pass filtering on the second clock signal with the second duty period to generate the second sensing voltage. The first clock signal and the second clock signal have the same period. A sum of the first duty period and the second duty period is 1. The voltage divider is electrically connected to the low-pass filter. The voltage divider is configured to generate the first control voltage based on the first sensing voltage and a constant internal bias voltage, and generate the second control voltage based on the second sensing voltage and the constant internal bias voltage. The first control voltage is generated by dividing the constant internal bias voltage by the first duty period, and the second control voltage is generated by dividing the constant internal bias voltage by the second duty period. The compensator is electrically connected to the voltage divider. The compensator is configured to generate a ramp voltage signal based on the first control voltage and the second control voltage. The equivalent series resistance compensation circuit outputs the ramp voltage signal, the constant internal bias voltage and the first sensing voltage.

In order to solve the above-mentioned conventional problems, an embodiment of the present disclosure provides an equivalent series resistance compensation circuit. The equivalent series resistance compensation circuit comprises a plurality of hardware circuits, and the hardware circuits are configured for as follows. The first sensing voltage and the second sensing voltage are respectively generated based on the first duty period, the second duty period and a given voltage. A sum of the first duty period and the second duty period is 1. The first control voltage is generated based on a constant internal bias voltage and the first sensing voltage. The second control voltage is generated based on the constant internal bias voltage and the second sensing voltage. The first control voltage is proportional to the constant internal bias voltage and inversely proportional to the first duty internal. The second control voltage is proportional to the constant internal bias voltage and inversely proportional to the second duty period. A ramp voltage signal is generated based on the first control voltage and the second control voltage. The ramp voltage signal, the constant internal bias voltage and the first sensing voltage are output.

In order to solve the above-mentioned conventional problems, an embodiment of the present disclosure provides a constant-frequency turn-on circuit. The constant-frequency turn-on circuit comprises the above-mentioned equivalent series resistance compensation circuit, a comparator, a turn-on time signal generator and a driving circuit. The comparator is electrically connected to the equivalent series resistance compensation circuit. The comparator is configured to compare the constant internal bias voltage with the ramp voltage signal and compare a reference voltage with a feedback voltage, so that the comparison result is generated. The turn-on time signal generator is electrically connected to the comparator and the equivalent series resistance compensation circuit. The turn-on time signal generator generates a turn-on time signal based on the comparison result and the first sensing voltage. The driving circuit is electrically connected to the turn-on time signal generator. The driving circuit is configured to generate the first clock signal, the second signal and the driving signal based on the turn-on time signal.

In order to solve the above-mentioned conventional problems, an embodiment of the present disclosure provides a voltage conversion device. The voltage conversion device comprises the above-mentioned constant-frequency turn-on circuit and a voltage converter. The voltage converter is electrically connected to a driving circuit of the constant-frequency turn-on circuit. The voltage converter is turned on or off to further determine whether a voltage conversion is performed based on a driving signal.

To sum up, the embodiments of the present disclosure provide the equivalent series resistance compensation circuit. The equivalent series resistance compensation circuit can generate the ramp voltage signal which the maximum amplitude and average amplitude thereof are constant. Therefore, the comparison result generated by the comparator of the constant-frequency turn-on circuit, that is, a compensation value, does not change accordingly and is easier to be controlled when the equivalent series resistance compensation circuit provided by the embodiments of the present disclosure is applied to the constant-frequency turn-on circuit of the voltage conversion device. As a result, the stability of the system is improved.

BRIEF DESCRIPTION OF THE DRAWINGS

In order to make the above-mentioned and other purposes, features, advantages and embodiments of the present disclosure more obvious and understandable, the accompanying drawing are described as follows.

DESCRIPTION OF THE PREFERRED EMBODIMENTS

The ramp voltage signal of the equivalent series resistance compensation circuit in the prior art is not linear and the average amplitude and the maximum amplitude of the ramp voltage signal changes with the input voltage and the turn-on time. In this way, the compensation value generated by the comparator, that is, a compensation value, changes accordingly and is difficult to control. Thus, it is difficult to design the stability of the system. Embodiments of the present disclosure design an equivalent series residence compensation circuit. The average amplitude and the maximum amplitude of the ramp voltage signal generated by the equivalent series residence compensation circuit are constant, so as to solve the above-mentioned technical problems in the prior art.

Further, the equivalent series residence compensation circuit comprises a plurality of hardware circuits, and the hardware circuits are configured for as follows. The first sensing voltage and the second sensing voltage are respectively generated based on the first duty period, the second duty period and a given voltage. The sum of the first duty period and the second duty period is 1. For example, the first duty period is 0.6, and the second duty period: is 0.4, but the present disclosure is not limited to this example. The first control voltage is generated based on a constant internal bias voltage and the first sensing voltage, and the second control voltage is generated based on the constant internal bias voltage and the second sensing voltage. The first control voltage is proportional to the constant internal bias voltage and inversely proportional to the first duty period. The second control voltage is proportional to the constant internal bias voltage and inversely proportional to the second duty period. A ramp voltage signal is generated based on the first control voltage and the second control voltage. The average amplitude of the ramp voltage signal is the first constant value, and the maximum amplitude of the ramp voltage signal is the second constant value. The ramp voltage signal, the constant internal bias voltage and the first sensing voltage are output. The plurality of hardware circuits mentioned above can be substantially configured as a pass filter, a voltage divider and a compensator, and the descriptions of them will be further described in detail as below.

Figure 1:
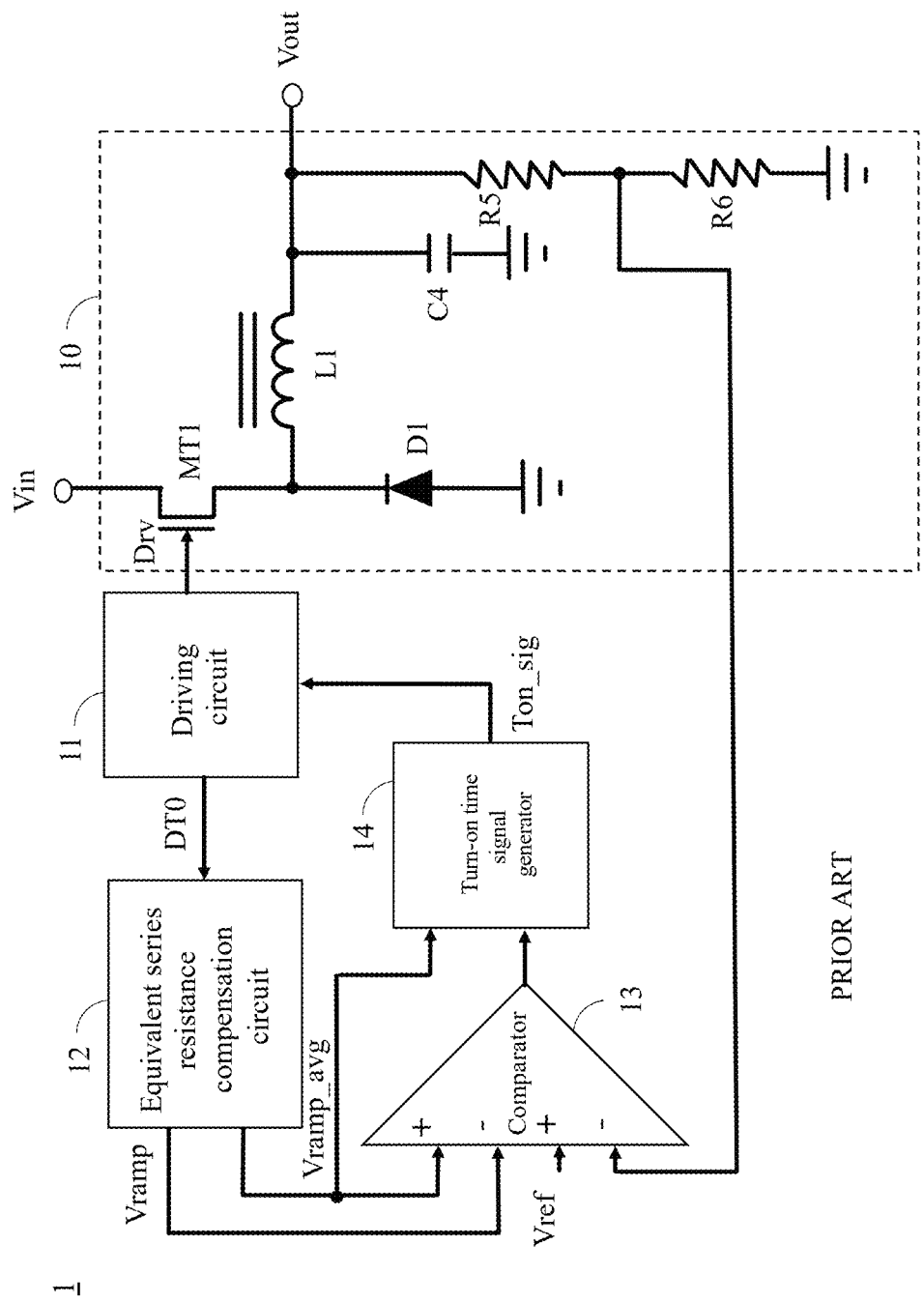
FIG. 1 is a circuit diagram of a voltage conversion device of prior art.
Figure 2:
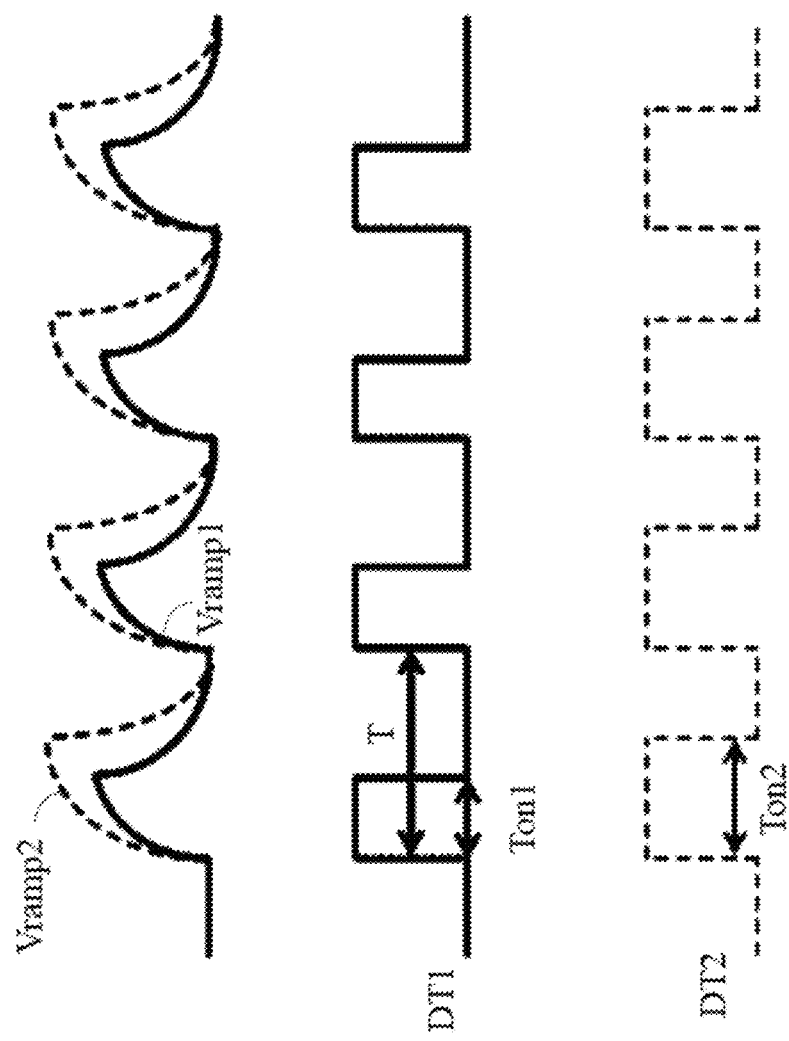
FIG. 2 is a waveform diagram of a ramp voltage signal corresponding to clock signals in different duty periods of a voltage conversion device of prior art.
Figure 3:
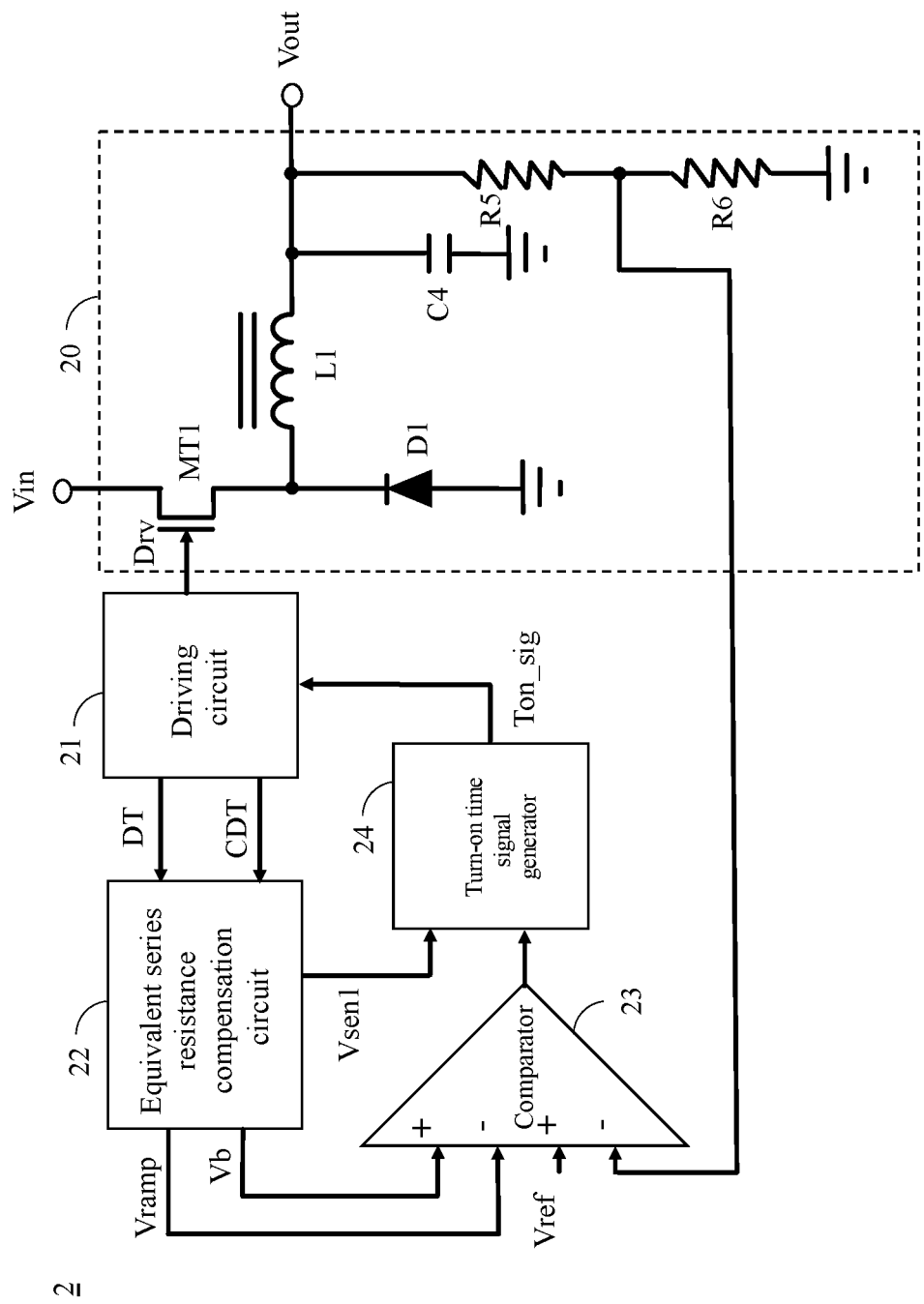
FIG. 3 is a circuit diagram of a voltage conversion device according to an embodiment of the present disclosure.

FIG. 3, FIG. 3 is a circuit diagram of a voltage conversion device according to an embodiment of the present disclosure. The voltage conversion device 2 comprises the voltage converter 20, the driving 21, the equivalent series resistance compensation circuit 22, the comparator 23 and the turn-on time signal generator 24. The driving circuit 21, the equivalent series resistance compensation circuit 22, the comparator 23 and the turn-on time signal generator 24 form a constant-frequency turn-on circuit. The voltage converter 20 is electrically connected to the driving circuit 21 of the constant-frequency turn-on circuit. The voltage converter 20 is turned on or off to further determine whether a voltage conversion is performed based on driving signal Drv. The voltage converter 20 is a DC-to-DC low voltage-drop converter. When the voltage converter 20 is turned on based on the driving signal Drv, that is, the driving transistor MT1 is turned on by the driving signal Drv, the voltage converter 20 is configured to perform a low voltage-drop conversion on the input voltage Vin to generate the output voltage Vout.

The voltage converter 20 comprises the driving transistor MT1, the diode D1, the inductor L1, the capacitor C4, the resisters R5 and R6. The driving transistor MT1 is an NMOS transistor. The drain of the driving transistor MT1 receives the input voltage Vin. The gate of the driving transistor MT1 receives the driving signal Drv. The source of the driving transistor MT1 is connected to the cathode of the diode D1 and one end of the inductor L1. The anode of the diode D1 is connected to a ground voltage. The other end of the inductor L1 is configured to generate the output voltage Vout, and the other end of the inductor L1 is electrically connected to one end of the capacitor C4 and one end of the resistor R5. The other end of the capacitor C4 is electrically connected the ground voltage. The other end of the resistor R5 is electrically connected to one end of the resistor R6. The other end of the resistor R6 is electrically connected to the ground voltage. A feedback voltage is obtained via dividing the output voltage Vout through the resistors R5 and R6.

The comparator 23 is electrically connected to the equivalent series resistance compensation circuit 22. The comparator 23 is configured to generate a comparison result via comparing the constant internal bias voltage Vb with the ramp voltage signal Vramp and comparing the reference voltage Vref with the feedback voltage. Further, when the constant internal bias voltage Vb is greater than the ramp voltage signal Vramp or the reference voltage Vref is greater than the feedback voltage, the comparison result changes from a logic low level to a logic high level.

The turn-on time signal generator 24 is electrically connected to the comparator 23 and the equivalent series resistance compensation circuit 22. The turn-on time signal generator 24 generates the turn-on time signal Ton_sig with information of the turn-on time Ton based on the comparison result and the first sensing voltage Vsen1. The first sensing voltage Vsen1 contains the information of the turn-on time Ton, and the comparison result can adjust the existing turn-on time Ton, for example, the existing turn-on time Ton is increased or decreased. The driving circuit 21 is electrically connected to the turn-on time signal generator 24. The driving circuit 21 is configured to generate the first clock signal DT, the second clock signal CDT and the driving signal Drv based on the turn-on time signal Ton_sig with the information of the turn-on time Ton.

The equivalent series resistance compensation circuit 22 outputs the ramp voltage signal Vramp, the constant internal bias voltage Vb and the first sensing voltage Vsen1. The comparator 23 compares the ramp voltage signal Vramp with the constant internal bias voltage Vb. Therefore, if the stability of the system is to be increased, the ramp voltage signal Vramp should be linear, so that the average amplitude and the maximum amplitude of the ramp voltage signal Vramp should be independent of the input voltage Vin and the turn-on time Ton. In an embodiment of the present disclosure, the equivalent series resistance compensation circuit 22 is designed so that the average amplitude and the maximum amplitude of the output ramp voltage signal Vramp are two constant values.

Figure 4:
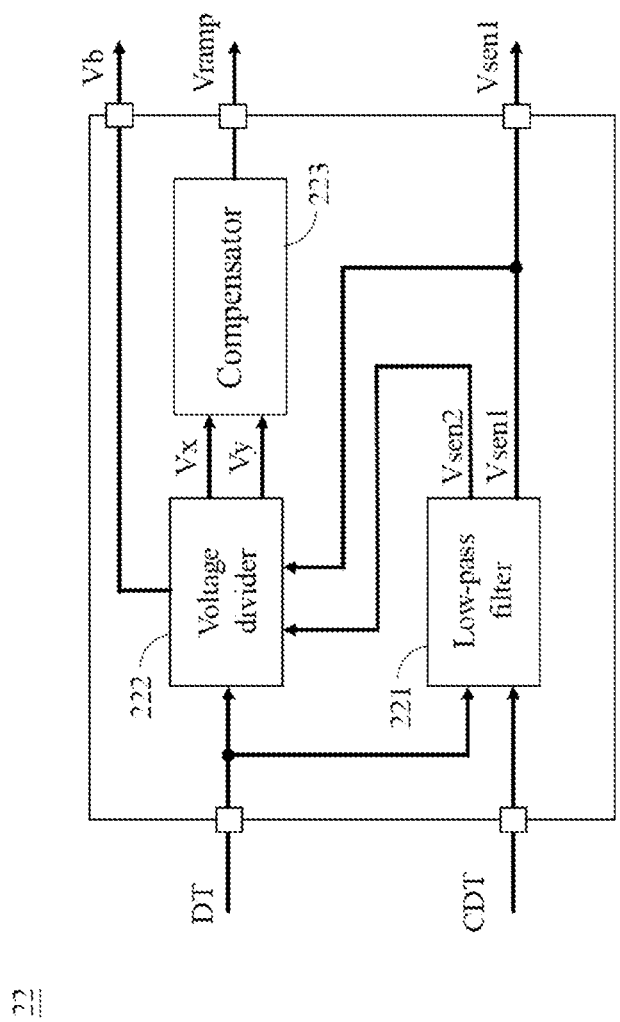
FIG. 4 is a block diagram of an equivalent series resistance compensation circuit of a constant-frequency turn-on circuit in a voltage conversion device according to an embodiment of the present disclosure.

Further, please refer to FIG. 4, FIG. 4 is a block diagram of an equivalent series resistance compensation circuit of a constant-frequency turn-on circuit in a voltage conversion device according to an embodiment of the present disclosure. The equivalent series resistance compensation circuit 22 comprises the low-pass filter 221, the voltage divider 222 and the compensator 223. The low-pass filter 221 is configured to perform a low-pass filtering on the first clock signal DT with the first duty period duty1 to generate the first sensing voltage Vsen1. The low-pass filter 221 is configured to perform the low-pass filtering on the second clock signal CDT with the second duty period duty2 to generate the second sensing voltage Vsen2. The first clock signal DT and the second clock signal CDT have the same period T. A sum of the first duty period duty1 and the second duty period duty2 is 1, that is, duty2=1−duty1.

The voltage divider 222 is electrically connected to the low-pass filter 221. The voltage divider 222 is configured to generate the first control voltage Vx based on the first sensing voltage Vsen1 and the constant internal bias voltage Vb. The voltage divider 222 is configured to generate the second control voltage Vy based on the second sensing voltage Vsen2 and the constant internal bias voltage Vb. The first control voltage Vx is the constant internal bias voltage Vb divided by the first duty period duty1, that is, Vx=Vb/duty1=Vb*T/Ton. The second control voltage Vy is the constant internal bias voltage Vb divided by the second duty period duty2, that is, Vy=Vb/(1−duty1)=Vb*T/(T−Ton).

The compensator 223 is electrically connected to the voltage divider 222. The compensator 223 is configured to generate the ramp voltage signal Vramp based on the first control voltage Vx and the second control voltage Vy. The average amplitude Vramp_avg of the ramp voltage signal Vramp is the first constant value, and the maximum amplitude Vramp_top of the ramp voltage signal Vramp is the second constant value. The equivalent series resistance compensation circuit 22 outputs the ramp voltage signal Vramp, the constant internal bias voltage Vb and the first sensing voltage Vsen1. The second constant value is a product of the period T and the constant internal bias voltage Vb divided by the given capacitance value C1 and the given resistance value R1, that is, Vramp_top=T*Vb/(C1*R1). The first constant value is the constant internal bias voltage Vb, that is, Vramp_avg=Vb.

Figure 5:
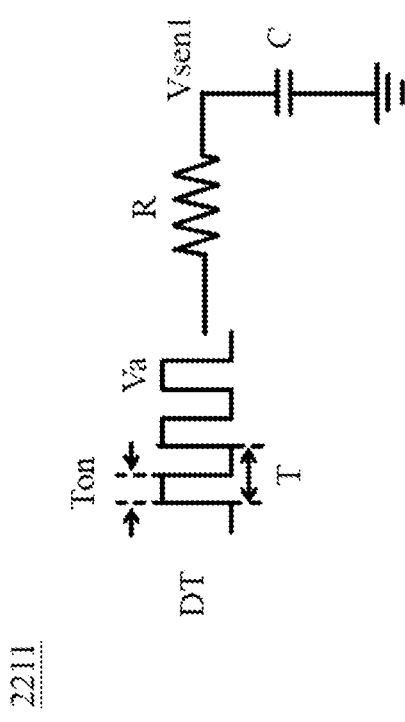
FIG. 5 is a circuit diagram of a first low-pass filter circuit of a low-pass filter of an equivalent series resistance compensation circuit according to an embodiment of the present disclosure.
Figure 6:
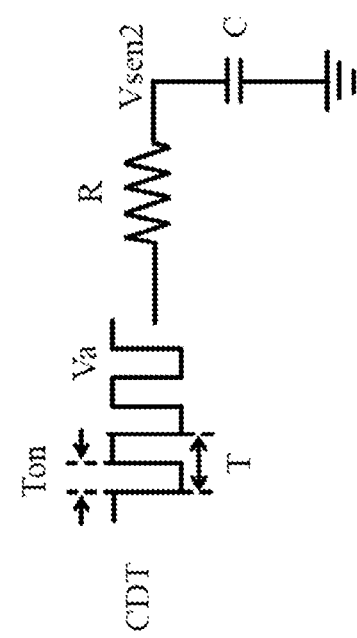
FIG. 6 is a circuit diagram of a second low-pass filter circuit of a low-pass filter of an equivalent series resistance compensation circuit according to an embodiment of the present disclosure.

Next, one of the implementations of the low-pass filter 221 is described as follows. Please refer to FIG. 5 and FIG. 6, FIG. 5 is a circuit diagram of a first low-pass filter circuit of a low-pass filter of an equivalent series resistance compensation circuit according to an embodiment of the present disclosure, and FIG. 6 is a circuit diagram of a second low-pass filter circuit of a low-pass filter of an equivalent series resistance compensation circuit according to an embodiment of the present disclosure. The low-pass filter 221 comprises the first RC low-pass filter circuit 2211 and the second RC low-pass filter circuit 2212. The first RC low-pass filter circuit 2211 comprises the resistor R and the capacitor C, and the resistor R and the capacitor C are connected in series. One end of the resistor R receives the first clock signal DT. The first sensing voltage Vsen1 is generated at the junction of the resistor R and the capacitor C. The first sensing voltage Vsen1 is a product of the given voltage Va and the first duty period duty1, that is, Vsen1=Va*duty1. The given voltage Va is a voltage of the first clock signal at a logic high level. The second RC low-pass filter circuit 2212 receives the second clock signal CDT. The second RC low-pass filter circuit 2212 is configured to generate the second sensing voltage Vsen2. The second sensing voltage is a product of the given voltage Va and the second duty period duty2, that is, Vsen2=Va*duty2.

Figure 7:
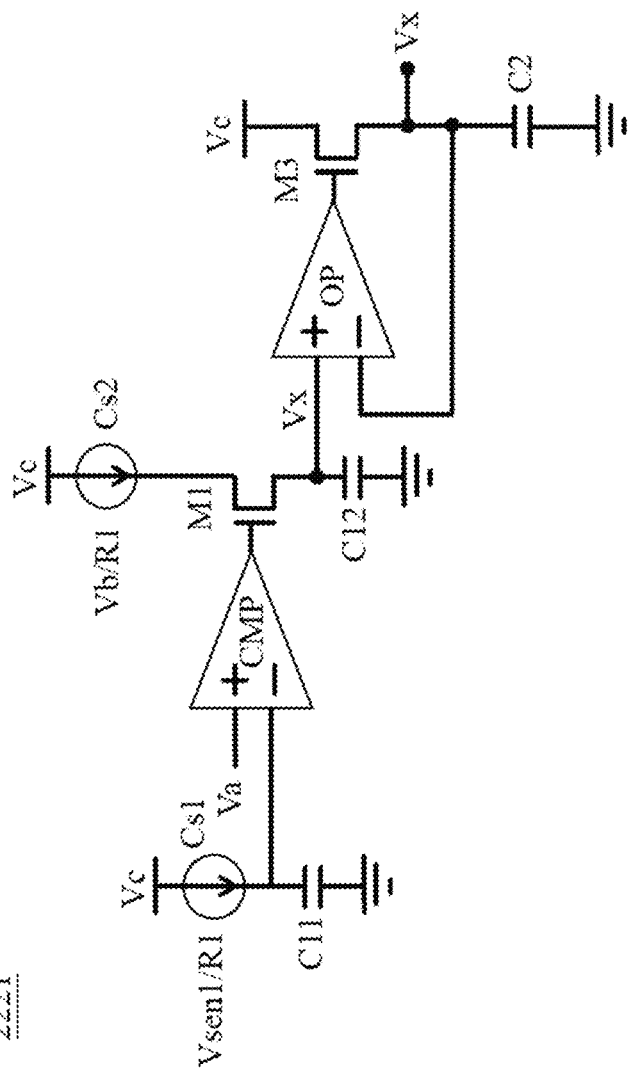
FIG. 7 is a circuit diagram of a first voltage dividing circuit of a voltage divider of an equivalent series resistance compensation circuit according to an embodiment of the present disclosure.
Figure 8:
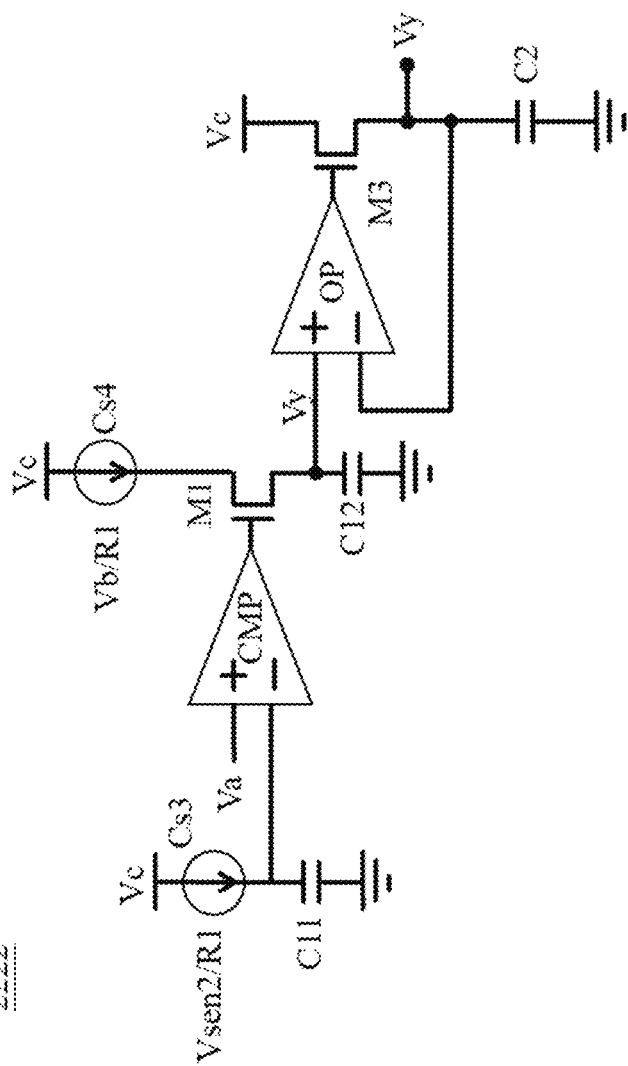
FIG. 8 is a circuit diagram of a second voltage dividing circuit of a voltage divider of an equivalent series resistance compensation circuit according to an embodiment of the present disclosure.

Then, one of the implementations of the voltage divider 222 is described as follows. Please refer to FIG. 7 and FIG. 8, FIG. 7 is a circuit diagram of a first voltage dividing circuit of a voltage divider of an equivalent series resistance compensation circuit according to an embodiment of the present disclosure, and FIG. 8 is a circuit diagram of a second voltage dividing circuit of a voltage divider of an equivalent series resistance compensation circuit according to an embodiment of the present disclosure. The voltage divider 222 comprises the first voltage dividing unit 2221 and the second voltage dividing unit 2222. The first voltage dividing unit 2221 comprises the first controller and the first controllable charging circuit. The second voltage dividing unit 2222 comprises the second controller and the second controllable charging circuit. The first controller comprises the current source Cs1, the capacitor C11 with the given capacitance value C1 and the comparator CMP of FIG. 7. The first controllable charging circuit comprises the transistors M1, M3, the capacitor C12 with the given capacitance value C1, the operational amplifier OP, the capacitor C2 and the current source Cs2 of FIG. 7. The second controller comprises the current source Cs3, the capacitor C11 with the given capacitance value C1 and the comparator CMP of FIG. 8. The second controllable charging circuit comprises the transistors M1, M3, the capacitor C12 with the given capacitance value C1, the operational amplifier OP, the capacitor C2 and the current source Cs4 of FIG. 8.

In FIG. 7, the current source Cs1 is electrically connected to the capacitor C11. The comparator CMP is electrically connected to one end of the capacitor C11. The comparator CMP receives the first capacitance voltage generated by the capacitor C11 and receives the given voltage Va. The current source Cs1 of the first controller divides the first sensing voltage Vsen1 by the given resistance value R1 to generate the first sensing current, that is, Vsen1/R1, for charging the capacitor C11 of the given capacitance value C1 to further generate the first capacitance voltage. The comparator CMP of the first controller compares the given voltage Va with the first capacitance voltage to generate the first control signal to the transistor M1 which is electrically connected to the comparator CMP.

In FIG. 7, the gate of the transistor M1 is electrically connected to the comparator CMP. The drain of the transistor M1 is electrically connected to the current source Cs2. The source of the transistor M1 is electrically connected to the capacitor C12. The operational amplifier OP is electrically connected the gate of the transistor M3, the capacitors C2 and C12. The drain of the transistor M3 receives the voltage Vc. The source of the transistor M3 is configured to output the first control voltage Vx, and the source of the transistor M3 is electrically connected to the capacitor C12. The transistor M3, the operational amplifier OP and the capacitor C2 form a buffer via a negative feedback. The transistor M1 of the first controllable charging circuit is turned on based on the first control signal, and the turning-on of the first controllable charging circuit depends on whether the transistor M1 is turned on. The current source Cs2 divides the constant internal bias voltage Vb by the given resistance value: R1 to generate the first constant current for charging the capacitor C12 of the given capacitance value C1 and generate the first control voltage Vx. After the first control voltage Vx passes through the buffer, the first control voltage Vx is output. It should be noted here that the configured buffer formed by the transistor M3, the operational amplifier OP and the capacitor C2 may be removed in some embodiments.

In FIG. 8, the current source Cs3 is electrically connected to the capacitor C11. The comparator CMP is electrically connected to one end of the capacitor C11. The comparator CMP receives the second capacitance voltage generated by the capacitor C11 and receives the given voltage Va. The current source Cs3 of the second controller divides the second sensing voltage Vsen2 by the given resistance value R1 to generate the second sensing current, that is, Vsen2/R1, for charging the capacitor C11 of the given capacitance value C1 to further generate the second capacitance voltage. The comparator CMP of the second controller compares the given voltage Va with the second capacitance voltage to generate the second control signal to the transistor M1 which is electrically connected to the comparator CMP.

In FIG. 8, the gate of the transistor M1 is electrically connected to the comparator CMP. The drain of the transistor M1 is electrically connected to the current source Cs4. The source of the transistor M1 is electrically connected to the capacitor C12. The operational amplifier OP is electrically connected to the gate of the transistor M3, the capacitors C2 and C12. The drain of the transistor M3 receives the voltage Vc. The source of the transistor M3 is configured to output the second control voltage Vy, and the source of the transistor M3 is electrically connected to the capacitor C12. The transistor M3, the operational amplifier OP and the capacitor C2 form a buffer via the negative feedback. The transistor M1 of the second controllable charging circuit is turned on based on the second control signal, and the turning-on of the second controllable charging circuit depends on whether the transistor M1 is turned on. The current source Cs4 divides the constant internal bias voltage Vb by the given resistance value R1 to generate the second constant current for charging the capacitor C12 of the given capacitance value C1 and generate the second control voltage Vy. After the second control voltage Vy passes through the buffer, the second control voltage Vy is output. It should be noted here that the configured buffer formed by the transistor M3, the operational amplifier OP and the capacitor C2 may be removed in some embodiments.

Figure 9:
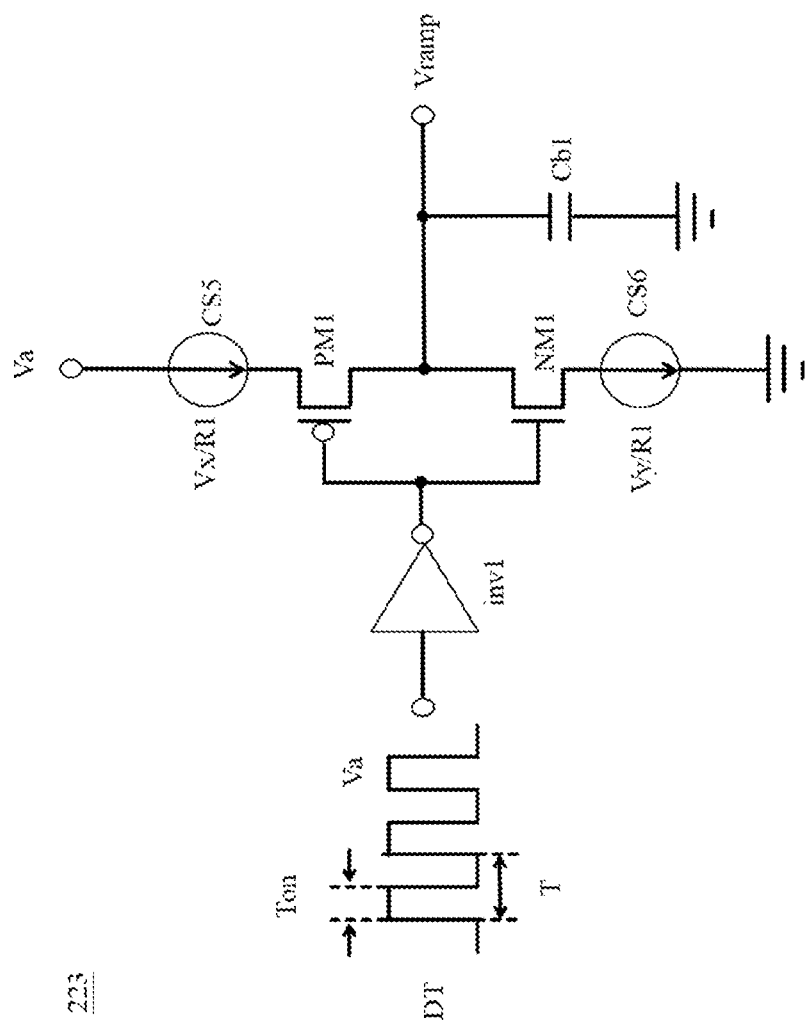
FIG. 9 is circuit diagram of a compensator of an equivalent series resistance compensation circuit according to an embodiment of the present disclosure.

Next, one of the implementations of the compensator 223 is described as follows. Please refer to FIG. 9, FIG. 9 is circuit diagram of a compensator of an equivalent series resistance compensation circuit according to an embodiment of the present disclosure. The compensator 223 comprises a current charging selection circuit. The current charging selection circuit comprises the inverter inv1, the transistors PM1, NM1, the current sources Cs5, Cs6 and the capacitor Cb1. The inverter inv1 receives the first clock signal DT. The inverter inv1 is electrically connected to the gate of the transistor PM1 and the gate of the transistor NM1. The source of the transistor PM1 is electrically connected to the current source Cs5, and the source of the transistor NM1 is electrically connected to the current source Cs6. The drains of the transistors PM1, NM1 are electrically connected to the capacitor Cb1 to output the ramp voltage signal Vramp. The current source Cs5 is configured to divide the first control voltage Vx by the given resistance value R1 to generate the first bias current to the transistor PM1 of the current charging selection circuit. The transistor PM1 is a P-type transistor. The current source Cs6 is configured to divide the second control voltage Vy by the given resistance value R1 to generate the second bias current to the transistor NM1 of the current charging selection circuit. The transistor NM1 is an N-type transistor. One of the transistors PM1 and NM1 is turned on based on a reverse result of the first clock signal DT to select one of the first bias current and the second bias current to charge the capacitor Cb1 and further to generate the ramp voltage signal Vramp. In some embodiments, the inverter inv1 may not be provided, and the inverter inv1 is not a necessary component.

Figure 10:
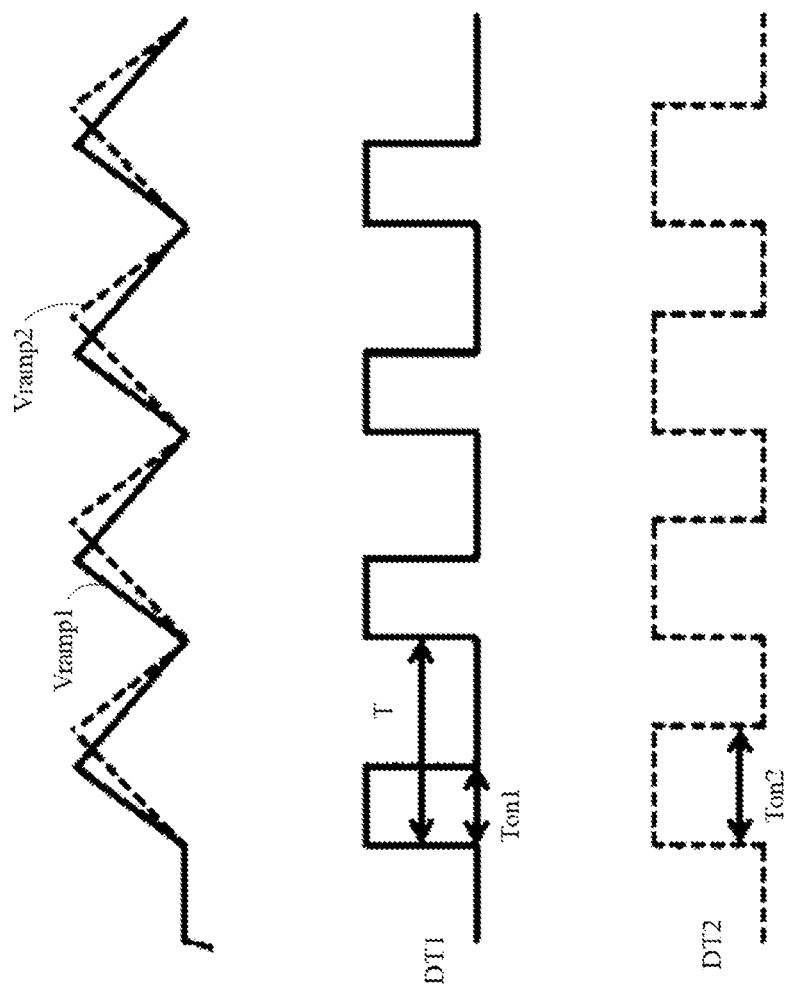
FIG. 10 is a waveform of a ramp voltage signal corresponding to clock signals in different duty periods of an equivalent series resistance compensation circuit according to an embodiment of the present disclosure.

Please refer to FIG. 10, FIG. 10 is a waveform of a ramp voltage signal corresponding to clock signals in different duty periods of an equivalent series resistance compensation circuit according to an embodiment of the present disclosure. When the period is T and the clock signals DT1 and DT2 with the turn-on times Ton1 and Ton2 respectively are used as the clock signals DT and CDT of FIG. 3, the ramp voltage signal Vramp generated by the equivalent series resistance compensation circuit 22 is the ramp voltage signals Vramp1 and Vramp2, respectively. Although the turn-on times Ton1 and Ton2 are different from each other, the maximum amplitudes of the ramp voltage signals Vramp1 and Vramp2 are the same. The average amplitudes of the ramp voltage signals Vramp1 and Vramp2 are the same.

As stated above, the embodiments of the present disclosure design the equivalent series resistance compensation circuit comprising the plurality of hardware circuits. By the functions of these hardware circuits, the ramp voltage signal with the constant average amplitude and the constant maximum amplitude is finally generated. As a result, the voltage conversion device utilizing the equivalent series resistance compensation circuit can have the better stability of the system.

It should be understood that the examples and the embodiments described herein are for illustrative purpose only, and various modifications or changes in view of them will be suggested to those skilled in the art, and will be included in the spirit and scope of the application and the appendix with the scope of the claims.

What is claimed is:

1. An equivalent series resistance compensation circuit, comprising:
   a low-pass filter, configured to perform a low-pass filtering on a first clock signal with a first duty period to generate a first sensing voltage, and perform the low-pass filtering on a second clock signal with a second duty period to generate a second sensing voltage,
      wherein the first clock signal and the second clock signal have the same period, and
      a sum of the first duty period and the second first duty period is 1;
   a voltage divider, electrically connected to the low-pass filter, configured to generate a first control voltage based on the first sensing voltage and a constant internal bias voltage, and generate a second control voltage based on the second sensing voltage and the constant internal bias voltage,
      wherein the first control voltage is generated by dividing the constant internal bias voltage by the first duty period, and the second control voltage is generated by dividing the constant internal bias voltage by the second duty period; and
   a compensator, electrically connected to the voltage divider, and configured to generate a ramp voltage signal based on the first control voltage and the second control voltage,
   wherein the equivalent series resistance compensation circuit outputs the ramp voltage signal, the constant internal bias voltage and the first sensing voltage;
   wherein an average amplitude of the ramp voltage signal is a first constant value, a maximum amplitude of the ramp voltage signal is a second constant value, the second constant value is a product of the period and the constant internal bias voltage divided by a given capacitance value and a given resistance value, and the first constant value is the constant internal bias voltage;
   wherein the low-pass filter comprises:
   a first RC low-pass filter circuit, configured to receive the first clock signal, and generate the first sensing voltage, wherein the first sensing voltage is a product of a given voltage and the first duty period, and wherein the given voltage is a voltage of the first clock signal at a logic high level; and a second RC low-pass filter circuit, configured to receive the second clock signal, and generate the second sensing voltage, wherein the second sensing voltage is a product of the given voltage and the second duty period.

2. The equivalent series resistance compensation circuit according to claim 1, wherein the voltage divider comprises:

a first controller, configured to divide the first sensing voltage by the given resistance value to generate a first sensing current for charging a first sensing capacitor of the given capacitance value and generate a first capacitance voltage, and then compare the given voltage with the first capacitance voltage to generate a first control signal;

a first controllable charging circuit, wherein the first controllable charging circuit is turned on based on the first control signal to receive a first constant current, wherein the first controllable charging circuit charges a first charge capacitor of the given value via the first constant current to generate the first control voltage, and wherein the first constant current is the constant internal bias voltage divided by the given resistance value;

a second controller, configured to divide the second sensing voltage by the given resistance value to generate a second sensing current for charging a second sensing capacitor of the given capacitance value and generate a second capacitance voltage, and then compare the given voltage with the second capacitance voltage to generate a second control signal; and a second controllable charging circuit, wherein the second controllable charging circuit is turned on based on the second control signal to receive a second constant current, wherein the second controllable charging circuit charges a second charge capacitor of the given capacitance value via the second constant current to generate the second control voltage, and wherein the second constant current is the constant internal bias voltage divided by the given resistance value.

3. The equivalent series resistance compensation circuit according to claim 2, wherein the compensator comprises:

a current charging selection circuit, configured to receive a first bias current and a second bias current, wherein the current charging selection circuit selects the first bias current or the second bias current to charge a charge capacitor of the given capacitance value to generate the ramp voltage signal based on the first clock signal, wherein the first bias current is the first control voltage divided by the given resistance value, and wherein the second bias current is the second control voltage divided by the given resistance value.

4. A constant-frequency turn-on circuit, comprising:

an equivalent series resistance compensation circuit, comprising:

a low-pass filter, configured to perform a low-pass filtering on a first clock signal with a first duty period to generate a first sensing voltage, and performing the low-pass filtering on a second clock signal with a second duty period to generate a second sensing voltage, wherein the first clock signal and the second clock signal have the same period, and a sum of the first duty period and the second first duty period is 1;

a voltage divider, electrically connected to the low-pass filter, configured to generate a first control voltage based on the first sensing voltage and a constant internal bias voltage, and generate a second control voltage based on the second sensing voltage and the constant internal bias voltage, wherein the first control voltage is generated by dividing the constant internal bias voltage by the first duty period, and the second control voltage is generated by dividing the constant internal bias voltage by the second duty period; and a compensator, electrically connected to the voltage divider, and configured to generate a ramp voltage signal based on the first control voltage and the second control voltage, wherein the equivalent series resistance compensation circuit outputs the ramp voltage signal, the constant internal bias voltage and the first sensing voltage;

a comparator, electrically connected to the equivalent series resistance compensation circuit, and configured to generate a comparison result by comparing the constant internal bias voltage with the ramp voltage signal and comparing a reference voltage with a feedback voltage;

a turn-on time signal generator, electrically connected to the comparator and the equivalent series resistance compensation circuit, wherein the turn-on time signal generator generates a turn-on time signal based on the comparison result and the first sensing voltage; and a driving circuit, electrically connected to the turn-on time signal generator, and configured to generate the first clock signal, the second clock signal and a driving signal based on the turn-on time signal.

5. The constant-frequency turn-on circuit according to claim 4, wherein an average amplitude of the ramp voltage signal is a first constant value, and a maximum amplitude of the ramp voltage signal is a second constant value, the second constant value is a product of the period and the constant internal bias voltage divided by a given capacitance value and a given resistance value, and wherein the first constant value is the constant internal bias voltage.

6. The constant-frequency turn-on circuit according to claim 5, wherein the low-pass filter comprises:

a first RC low-pass filter circuit, configured to receive the first clock signal, and generate the first sensing voltage, wherein the first sensing voltage is a product of a given voltage and the duty period, and wherein the given voltage is a voltage of the first clock signal at a logic high level; and a second RC low-pass filter circuit, configured to receive the second clock signal, and generate the second sensing voltage, wherein the second sensing voltage is a product of the given voltage and the second duty period.

7. The constant-frequency turn-on circuit according to claim 6, wherein the voltage divider comprises:

a first controller, configured to divide the first sensing voltage by the given resistance value to generate a first sensing current for charging a first sensing capacitor of the given capacitance value and generate a first capacitance voltage, and then compare the given voltage with the first capacitance voltage to generate a first control signal;

a first controllable charging circuit,
wherein the first controllable charging circuit is turned on based on the first control signal to receive a first constant current,
wherein the first controllable charging circuit charges a first charge capacitor of the given value via the first constant current to generate the first control voltage, and
wherein the first constant current is the constant internal bias voltage divided by the given resistance value;
a second controller, configured to divide the second sensing voltage by the given resistance value to generate a second sensing current for charging a second sensing capacitor of the given capacitance value and generate a second capacitance voltage, and then compare the given voltage with the second capacitance voltage to generate a second control signal; and
a second controllable charging circuit,
wherein the second controllable charging circuit is turned on based on the second control signal to receive a second constant current,
wherein the second controllable charging circuit charges a second charge capacitor of the given capacitance value via the second constant current to generate the second control voltage, and
wherein the second constant current is the constant internal bias voltage divided by the given resistance value.

8. The constant-frequency turn-on circuit according to claim 7, wherein the compensator comprises:
a current charging selection circuit, configured to receive a first bias current and a second bias current,
wherein the current charging selection circuit selects the first bias current or the second bias current to charge a charge capacitor of the given capacitance value to generate the ramp voltage signal based on the first clock signal,
wherein the first bias current is the first control voltage divided by the given resistance value, and
wherein the second bias current is the second control voltage divided by the given resistance value.

9. A voltage conversion device, comprising:
a constant-frequency turn-on circuit, comprising:
an equivalent series resistance compensation circuit, comprising:
a low-pass filter, configured to perform a low-pass filtering on a first clock signal with a first duty period to generate a first sensing voltage, and performing the low-pass filtering on a second clock signal with a second duty period to generate a second sensing voltage, wherein the first clock signal and the second clock signal have the same period, and wherein a sum of the first duty period and the second first duty period is 1;
a voltage divider, electrically connected to the low-pass filter, configured to generate a first control voltage based on the first sensing voltage and a constant internal bias voltage, and generate a second control voltage based on the second sensing voltage and the constant internal bias voltage, wherein the first control voltage is generated by dividing the constant internal bias voltage by the first duty period, and the second control voltage is generated by dividing the constant internal bias voltage by the second duty period; and a compensator, electrically connected to the voltage divider, and configured to generate a ramp voltage signal based on the first control voltage and the second control voltage, wherein an average amplitude of the ramp voltage signal is a first constant value, and a maximum amplitude of the ramp voltage signal is a second constant value;
wherein the equivalent series resistance compensation circuit outputs the ramp voltage signal, the constant internal bias voltage and the first sensing voltage;
a comparator, electrically connected to the equivalent series resistance compensation circuit, and configured to generate a comparison result via comparing the constant internal bias voltage and the ramp voltage signal and comparing a comparison reference voltage with a feedback voltage;
a turn-on time signal generator, electrically connected to the comparator and the equivalent series resistance compensation circuit, wherein the turn-on time signal generator generates a turn-on time signal based on the comparison result and the first sensing voltage; and
a driving circuit, electrically connected to the turn-on time signal generator, configured to generate the first clock signal, the second clock signal and a driving signal; and
a voltage converter, electrically connected to the driving circuit of the constant-frequency turn-on circuit, wherein the voltage converter is turned on or off to determine whether a voltage conversion is performed based on the driving signal.

10. The voltage conversion device according to claim 9, wherein the second constant value is a product of the period and the constant internal bias voltage divided by a given capacitance value and a given resistance value, and wherein the first constant value is the constant internal bias voltage.

11. The voltage conversion device according to claim 10, wherein the low-pass filter comprises:
a first RC low-pass filter circuit, configured to receive the first clock signal, and generate the first sensing voltage, wherein the first sensing voltage is a product of a given voltage and the duty period, and
wherein the given voltage is a voltage of the first clock signal at a logic high level; and
a second RC low-pass filter circuit, configured to receive the second clock signal, and generate the second sensing voltage,
wherein the second sensing voltage is a product of the given voltage and the second duty period.

12. The voltage conversion device according to claim 11, wherein the voltage divider comprises:
a first controller, configured to divide the first sensing voltage by the given resistance value to generate first sensing current for charging a first sensing capacitor of the given capacitance value and generate a first capacitance voltage, and then compare the given voltage with the first capacitance voltage to generate a first control signal;
a first controllable charging circuit,
wherein the first controllable charging circuit is turned on based on the first control signal to receive a first constant current,
wherein the first controllable charging circuit charges a first charge capacitor of the given value via the first constant current to generate the first control voltage, and wherein the first constant current is the constant internal bias voltage divided by the given resistance value;

a second controller, configured to divide the second sensing voltage by the given resistance value to generate a second sensing current for charging a second sensing capacitor of the given capacitance value and generate a second capacitance voltage, and then compare the given voltage with the second capacitance voltage to generate a second control signal; and a second controllable charging circuit,
wherein the second controllable charging circuit is turned on based on the second control signal to receive a second constant current,
wherein the second controllable charging circuit charges a second charge capacitor of the given capacitance value via the second constant current to generate the second control voltage, and
wherein the second constant current is the constant internal bias voltage divided by the given resistance value.

13. The voltage conversion device according to claim 12, wherein the compensator comprises:
a current charging selection circuit, configured to receive a first bias current and a second bias current,
wherein the current charging selection circuit selects the first bias current or the second bias current to charge a charge capacitor of the given capacitance value based on the first clock signal to generate the ramp voltage signal,
wherein the first bias current is the first control voltage divided by the given resistance value, and
wherein the second bias current is the second control voltage divided by the given resistance value.

14. The voltage converter according to claim 9, wherein the voltage converter is a DC-to-DC low voltage-drop converter.

* * * * *